United States Patent
Becker et al.

(10) Patent No.: US 6,865,712 B2
(45) Date of Patent: Mar. 8, 2005

(54) OPTIMIZED TURBO DECODER

(75) Inventors: Burkhard Becker, Ismaning (DE);
Markus Doetsch, Schliern (DE); Peter Jung, Otterberg (DE); Tideya Kella, München (DE); Jörg Plechinger, München (DE); Peter Schmidt, Ellerstadt (DE); Michael Schneider, München (DE)

(73) Assignee: Infineon Technologies AG, Munich (DE)

( * ) Notice: Subject to any disclaimer, the term of this patent is extended or adjusted under 35 U.S.C. 154(b) by 336 days.

(21) Appl. No.: 10/244,790

(22) Filed: Sep. 16, 2002

(65) Prior Publication Data

US 2003/0067868 A1 Apr. 10, 2003

Related U.S. Application Data

(63) Continuation of application No. PCT/DE01/00983, filed on Mar. 12, 2001.

(30) Foreign Application Priority Data

Mar. 16, 2000 (DE) .......................................... 100 12 873

(51) Int. Cl.[7] .............................................. H03M 13/00
(52) U.S. Cl. ...................................... 714/796; 375/341
(58) Field of Search ................................ 714/794–796, 714/791, 793, 786, 755; 375/341, 262

(56) References Cited

U.S. PATENT DOCUMENTS 6,580,769 B1 * 6/2003 Brown et al. ................ 375/341
6,598,204 B1 * 7/2003 Giese et al. ................. 714/795

FOREIGN PATENT DOCUMENTS

WO 00/10254 2/2000

OTHER PUBLICATIONS

Vogt et al., Comparison of different turbo decoder realizations for IMT–2000, 1999, Global Telecommunication Conference, p. 2704–2708.*
Jeon et al., An efficient turbo decoder architecture for IMT2000, 1999, IEEE, p. 301–304.*
Pietrobon, S. S. "Implementation And Performance Of A Turbo/MAP Decoder", John Wiley and Sons, Ltd., 1998, pp. 23–46.
Berens, F. et al.: "Implementation Aspects of Turbo–Decoders for Future Radio Applications", IEEE, 1999, pp. 2601–2605.
Vogt, J. et al.: "Comparison of Different Turbo Decoder Realizations For IMT–2000", IEEE, 1999, pp. 2704–2708.
Dawid, H. et al.: "Scalable Architectures For High Speed Channel Decoding", IEEE, 1994, pp. 226–235.
Dawid, H. et al.: "Real–Time Algorithms and VLSI Architectures for Soft Output MAP Convolutional Decoding", IEEE, 1995, pp. 193–197.
Jung, P.: "Analyse und Entwurf digitaler Mobilfunksysteme" [Analysis and Design of Mobile Radio Systems], B.G. Teubner Stuttgart, 1997, pp. 344–368.
Jung, P.: "Comparison of Turbo–Code Decoders Applied to Short Frame Transmission Systems", IEEE, 1996, pp. 530–537.

* cited by examiner

*Primary Examiner*—Shelly A Chase
(74) *Attorney, Agent, or Firm*—Laurence A. Greenberg; Werner H. Stemer; Gregory L. Mayback (57) ABSTRACT

A turbo decoder for decoding a data signal transmitted via a disturbed channel has a symbol estimator. The symbol estimator contains a computing device, which, with knowledge of the error protection code used at the transmitter end, calculates transition metric values, forward and reverse recursion metric values and the output values (LLR). The computing device includes at least one hardware computing chip constructed of combinatorial logic for generating at least one type of the values.

16 Claims, 9 Drawing Sheets

OPTIMIZED TURBO DECODER

CROSS-REFERENCE TO RELATED APPLICATION

This application is a continuation of copending International Application No. PCT/DE01/00983, filed Mar. 12, 2001, which designated the United States and was not published in English.

BACKGROUND OF THE INVENTION

Field of the Invention

The invention relates to a turbo decoder for decoding a data signal, which is error-protection-coded with a turbo code.

A basic problem in telecommunication lies in transmitting a data signal as free of errors as possible via a disturbed channel. To achieve this, the data signal to be transmitted is subjected to channel coding. The signal to be transmitted is adapted to the characteristics of the transmission channel by the channel coding. Several different channel coding methods are used. The principle of channel coding (which is also called error protection coding) is based on achieving an effective error protection by selective introduction of redundancy into the signal to be transmitted. Particular problems in conjunction with the signal transmission arise in mobile radio systems. This is attributable to the fact that, on the one hand, in mobile radio systems, severe signal distortions occur at the receiver due to time-variant multiple reflections, common-channel interference, doppler shift and noise. On the other hand, the receiver of a mobile station only has limited power and hardware resources due to space and cost constraints. Therefore, in mobile radio engineering, it is attempted to achieve a reconstruction of the transmitted signal with the least possible error rate as hardware-efficiently as possible (i.e., saving space and cost) with the least possible expenditure on signal processing (i.e., preserving the power resource).

It can be seen that the requirements cannot be optimized at the same time, but a meaningful compromise between the requirements must be created by selective software/hardware configuration of the receiver.

A modern method of error protection coding is "turbo coding". In turbo coding, "turbo codes" are used. Turbo codes are binary recursive convolution codes concatenated in parallel. Turbo codes represent an effective form of error protection coding, particularly in the transmission of large datablocks. A turbo decoder is used in the receiver for decoding turbo codes. Such a decoder is described at pages 343 to 368 (particularly FIG. E.2), of the book "Analyse und Entwurf digitaler Mobilfunksysteme" [Analysis and configuration of digital mobile radio systems] by P. Jung, Stuttgart, B. G. Teubner, 1997. The turbo decoder includes two recursively interconnected MAP symbol estimators between which a turbo code interleaver is disposed.

An obstacle in the implementation of turbo codes is that turbo decoders require considerable signal processing and hardware expenditure due to the iterative signal processing and the two MAP symbol estimators.

Therefore turbo codes have hitherto only been used in systems less restricted in resources such as, for example, satellite communication systems. Turbo codes are not yet used in the field of mobile radio communications due to the restrictions.

SUMMARY OF THE INVENTION

It is accordingly an object of the invention to provide an optimized turbo decoder that overcomes the hereinafore-mentioned disadvantages of the heretofore-known devices of this general type and that provides for signal decoding with little signal processing, thus saving power resources. In particular, the turbo decoder according to the invention is intended to be used in mobile radio receivers.

With the foregoing and other objects in view, there is provided, in accordance with the invention, a turbo decoder for decoding a data signal, which is error-protection-coded with a turbo code at a transmitter end, transmitted via a disturbed channel, and detected by a receiver. The turbo decoder contains at least one symbol estimator having an input for receiving data symbols attributable to the detected data signal. It further includes an output for providing output values for determining estimated data symbols of the data signal forming a basis for the error protection coding at the transmitter end. The turbo decoder also includes a computing device configured to calculate (with the error protection code used at the transmitter end) transition metric values, forward and reverse recursion metric values, and the output values therefrom. The computing device contains a hardware computing chip constructed of combinatorial logic for generating at least one type of the values.

Accordingly, the concept of the invention is based on producing a selective acceleration of the signal processing in the calculation of the transition metric values and/or the forward and reverse recursion metric values and/or the output values by the (at least one) hardware computing chip containing combinatorial logic, which is provided in the computing device.

Thus, at least one of the turbo decoder calculation procedures is completely executed in hardware, so that there is no time and energy-consuming program-processing. As a result, the entire turbo decoding sequence can be significantly accelerated.

An advantageous embodiment of the turbo decoder according to the invention is characterized in that the computing device contains a first hardware computing chip for generating transition metric values, which includes four adders disposed in parallel and at least one twos complement stage following the adders. In this manner, sixteen transition metrics (which can assume eight different values) can be calculated simultaneously in a very short time.

A further advantageous embodiment of the turbo decoder according to the invention is characterized in that the computing device contains a second hardware computing chip for generating forward and reverse recursion metric values, which includes an addition stage containing a number Q of adders disposed in parallel and a maximization stage containing maximum units disposed in parallel. Each maximum unit receives (at its input) the outputs from two adders and outputs the larger one of the adder outputs (at its output). In this manner, eight forward or reverse recursion metric values can be calculated simultaneously in a very short time.

The symbol estimator preferably includes a control device for controlling the second hardware computing chip, which has the effect that forward and reverse recursion intervals having sliding interval boundaries are used within a datablock for calculating the forward and reverse recursion metric values.

Fast calculation of output values is achieved by providing a third hardware computing chip, which includes an addition stage containing a number P of adders disposed in parallel and a maximization stage containing two maximum units disposed in parallel. Each maximum unit receives (at its input) the outputs from P/2 adders and outputs the largest of the adder outputs (at its output).

Naturally, the computing device can also comprise all three hardware computing chips mentioned. In this case, three hard-wired datapaths are implemented in the computing device, which execute the most important calculation steps in direct signal processing (without program processing).

The turbo decoder according to the invention also preferably includes a digital signal processor (DSP) for carrying out the turbo interleaving and deinterleaving procedures and for calculating statistical information representative of the instantaneous channel state in accordance with a predetermined sequence program. The DSP is connected to the symbol estimator via a bidirectional interface to exchange data.

In other words, the turbo decoder is divided into a computing section based on software processing (DSP with sequence program) and a computing section essentially operating at hardware level (symbol estimator). This division, in which the data transfer between the two computing sections is implemented by the bidirectional interface, has been found to be particularly advantageous from the point of view of a compromise between low-expenditure signal processing and supportable hardware expenditure.

A further advantageous variant of the turbo decoder according to the invention is characterized in that the symbol estimator is used both for calculating a first reliability information and a second reliability information during an iteration loop of the turbo decoder procedure. This multiplexed drive of the symbol estimator has the effect that the hardware expenditure (which is considerable in turbo code decoding) can still be kept within acceptable limits.

Other features which are considered as characteristic for the invention are set forth in the appended claims.

Although the invention is illustrated and described herein as embodied in an optimized turbo decoder, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
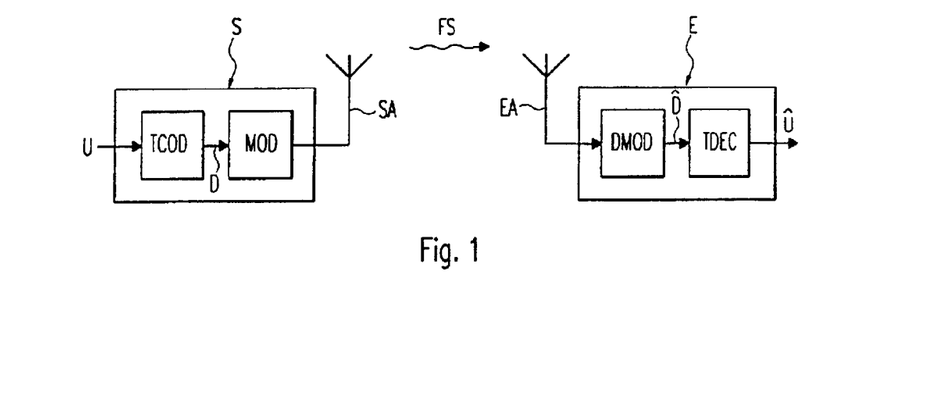
FIG. 1 is a schematic and block diagram of an air interface of a mobile radio system with a transmitter and a receiver.

Referring now to the figures of the drawings in detail and first, particularly to FIG. 1 thereof, there is shown a transmitter S and a receiver E of a mobile radio system. The transmitter S may be contained in a base station and the receiver E may be contained in a mobile station of the mobile radio system.

The transmitter S has a turbo coder TCOD, a modulator MOD and a transmitting antenna SA.

The turbo coder TCOD receives a digital input signal in the form of data symbols (for example, bits) $u_1, u_2, \ldots$ In the text which follows, a finite sequence $U=(u_1, u_2, \ldots, u_N)$ containing N input signal data symbols (e.g. bits) $u_n$, $n=1, 2, \ldots, N$ is considered due to the block-by-block coding. The number N designates the block size.

The input signal carries user information to be transmitted, for example a voice message. It can be generated, for example, via a chain of non-illustrated microphone-amplifier-analog/digital converter circuits.

The turbo coder TCOD adds redundancy to the digital input signal for error protection coding purposes. An error-protection-coded data signal is present (at the output of the turbo coder TCOD) in the form of a sequence D containing K data symbols (bits), $D=(d_1, d_2, \ldots, d_K)$.

The ratio N/K (number of input bits/number of output bits) is called the code rate $R_c$ of a coder.

The error-protection-coded data signal is modulated onto a carrier signal by a modulator MOD. The carrier signal modulated with the error-protection-coded data signal is spectrally shaped by a transmit filter in a non-illustrated manner, and is amplified by a transmit amplifier before it is transmitted as a radio signal FS via the transmitter antenna SA.

The receiver E has a receiving antenna EA, a demodulator DMOD and a turbo decoder TDEC.

The receiving antenna EA receives the radio signal FS, which is disturbed by environmental influences and interference with radio signals of other subscribers, and supplies the radio signal FS to the demodulator DMOD.

The demodulator DMOD equalizes the received radio signal FS after considering the signal disturbances suffered in the radio channel. An equalized data signal provided at the output of the demodulator DMOD is available in the form of a data symbol sequence $\hat{D}=(\hat{d}_1, \hat{d}_2, \ldots, \hat{d}_K)$ The elements $\hat{d}_1, \hat{d}_2, \ldots, \hat{d}_K$ are value-continuous estimates of the data symbols $d_1, d_2, \ldots, d_K$ of the error-protection-coded data symbol sequence D.

The equalized data signal is supplied to the turbo decoder TDEC. A decoded output signal sequence $\hat{U}=(\hat{u}_1, \hat{u}_2, \ldots, \hat{u}_N)$ is provided at the output of the TDEC. The elements $\hat{u}_1, \hat{u}_2, \ldots \hat{u}_N$ of the decoded output signal sequence $\hat{U}$ are hypotheses of the data symbols $u_1, u_2, \ldots u_N$ of the input signal at the transmitter end in the form of discrete values from the set of symbols (for example, 0, 1) of the input signal.

The data symbol error rate is defined by the relative frequency of estimation errors $u_n \neq \hat{u}_n$, where n=1, 2, ... It must not exceed a particular maximum permissible value in mobile radio applications.

Figure 2:
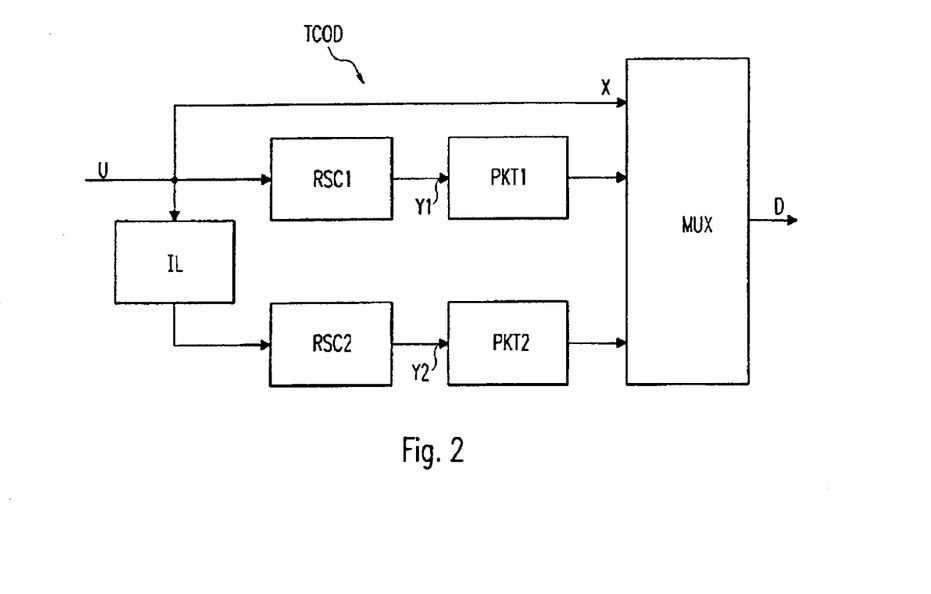
FIG. 2 is a block diagram of a turbo coder for generating a turbo code.

The generation of a turbo code is first explained by an example with FIG. 2 to provide a better understanding of the invention (before describing an exemplary embodiment of the turbo decoder according to the invention).

A turbo coder TCOD has two identical binary recursive systematic convolution coders RSC1 and RSC2, which are known as recursive systematic convolutional "RSC" coders in the coding technology. The input of the second RSC convolutional coder RSC2 is preceded by a turbo code interleaver IL, which interleaves the input data signal block by block. The outputs of the two convolutional coders RSC1 and RSC2 are in each case connected to a multiplexer device MUX via puncturing devices PKT1 and PKT2, respectively. The multiplexer device MUX is also supplied with a signal sequence X, which is identical to the digital input signal sequence U.

Figure 3:
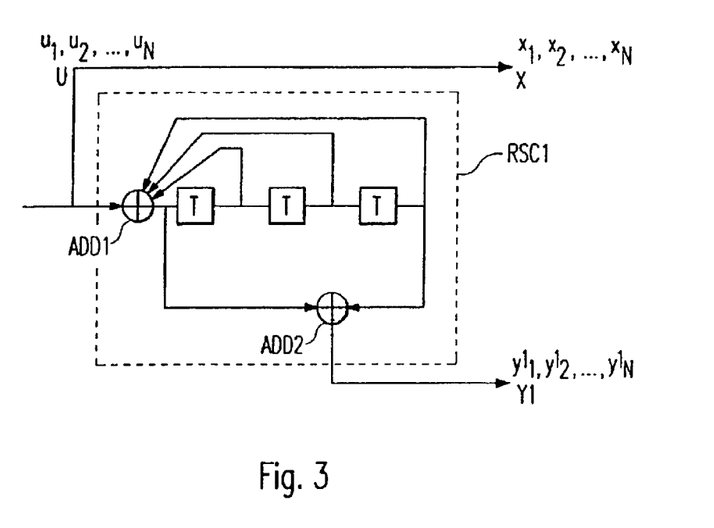
FIG. 3 is a block diagram of an RSC convolution coder of FIG. 2.

FIG. 3 shows the configuration of a recursive convolutional coder with RSC1. The convolutional coder RSC1 has a first adder ADD1 at its input, and a shift register (following the first adder ADD1) with three storage cells T. The convolutional coder RSC1 provides a redundant data sequence $Y1=(y1_1, y1_2, \ldots, y1_N)$ at its output, which is formed by a second adder ADD2.

Thus, a redundant data symbol $y1_n$ (n=1, 2, ..., N) present at the output at a particular time n depends on the current input data symbol $u_n$ of the input signal sequence U and on the state of the shift register.

The configuration of the second convolutional coder RSC2 is identical to the configuration of the first convolutional coder RSC1. RSC2 provides a redundant data sequence $Y2=(y2_1, y2_2, \ldots y2^N)$ at its output.

The signal sequence X can be considered as the second output of the first convolutional coder RSC1. In other words, the first convolutional coder RSC1 includes a second output at which the data sequence X is output. The elements $x_1, x_2, \ldots, x_N$ are identical to the elements $u_1, u_2, \ldots u_N$ of the input signal sequence U. This analogously applies to the second convolutional coder RSC2 and a non-illustrated second output X_I of the coder, which is identical to the interleaved input signal sequence U. Coders having this characteristic are generally called systematic coders.

Then, each convolutional coder RSC1 and RSC2 (as per input data symbol $u_n$) respectively, outputs exactly two output data symbols $x_n$ and $y1_n$ and, $x\_I_n$ (interleaved systematic information) and $y2_n$. Thus, each convolutional coder RSC1, RSC2 has a code rate $R_c=0.5$.

The multiplexer device MUX is used for adjusting the code rate of the turbo coder TCOD. The two redundant part-sequences Y1 and Y2 may be alternatively punctured and multiplexed to achieve a code rate of $R_c=0.5$ for the TCOD. The resultant redundant data sequence $Y=(y1_1, y2_2, y1_3, y2_4, \ldots, y1_N, y2_N)$ is alternately multiplexed with the systematic data sequence X. The error-protection-coded data signal resulting from this (special) form of turbo coding accordingly has, for example, the form $D=(x_1, y1_1, x_2, y2_2, x_3, y1_3, x_4, y2_4, \ldots x_N, y2_N)$ (N is assumed to be an even number).

The convolutional coder RSC1 can be considered as a finite clocked state machine and described by a "trellis diagram" having M possible states. The trellis diagram of the convolutional coder RSC1, with a shift register of 3 cells, has $M=2^3=8$ nodes, which correspond to the possible states of the shift register. A (arbitrary) first state m', which changes into a second state m by inputting an input bit ($u_n=0$ or 1) is connected to it by a connecting line in the trellis diagram. Each redundant part-sequence Y1 corresponds to a particular path along connecting lines through the trellis diagram of the RSC1 coder.

Trellis diagrams for illustrating the states of coders are known and will not be explained in greater detail here.

Figure 4:
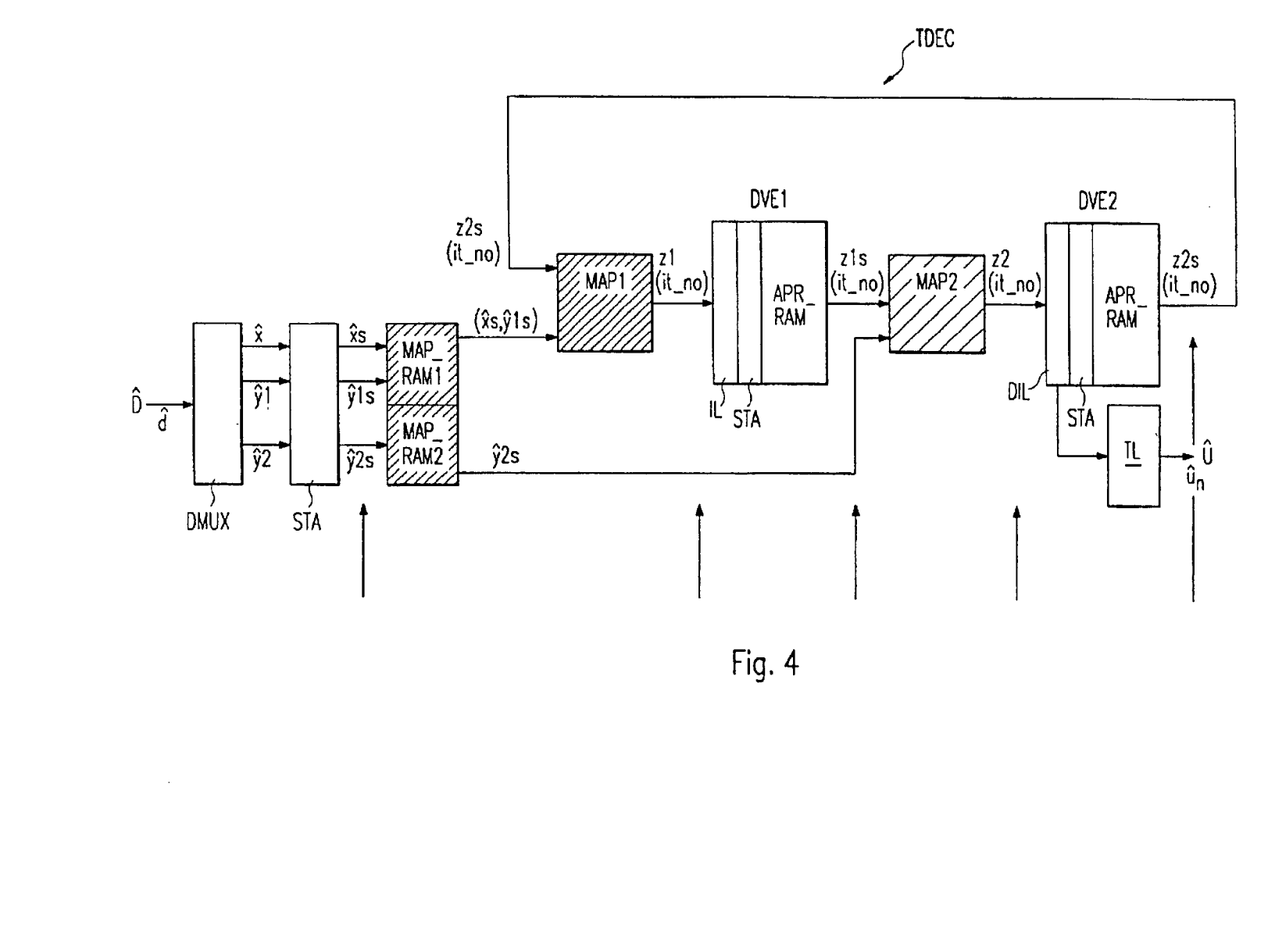
FIG. 4 is a functional block diagram illustrating an operation of a turbo decoder according to the invention.

FIG. 4 shows a block diagram for explaining the operation of an exemplary embodiment of a turbo decoder TDEC according to the invention.

The turbo decoder TDEC includes a demultiplexer DMUX, a statistics stage STA, a first and a second random access memory MAP_RAM1, MAP_RAM2, a first and a second MAP symbol estimator MAP1 and MAP2, a first and a second data processing unit DVE1, DVE2 and a decision logic (threshold decider) TL.

The first data processing unit DVE1 includes a turbo interleaver IL, a statistics stage STA and a data memory APR_RAM. The second data processing unit DVE2 includes a deinterleaver DIL, a statistics stage STA and a data memory APR_RAM.

The equalized data sequence $\hat{D}=(\hat{x}_1, \hat{y}1_1, \hat{x}_2, \hat{y}2_2, \hat{x}_3, \hat{y}1_3, \hat{x}4, \hat{y}2_4, \ldots \hat{x}_N, \hat{y}2_N)$ supplied to the turbo decoder TDEC from the demodulator DMOD is split by the demultiplexer DMUX (provided at the input end) into the equalized systematic data sequence $\hat{X}$ (the detected version of the input signal sequence U (=X)) and the two equalized redundant part-sequences $\hat{Y}1$ and $\hat{Y}2$ (i.e., the detected versions of the redundant part-sequences Y1 and Y2). The equalized (estimated) versions of the data symbols $x_n$, $y1_n$, $y2_n$ occurring at the transmitter end are designated by $\hat{x}_n, \hat{y}1_n, \hat{y}2_n$ (n=1, 2, ..., N). In the drawing, the indices n of the respective subsequent elements have been omitted for reasons of clarity.

The data symbols $\hat{x}_n$ (systematic information) and $\hat{y}1_n$, $\hat{y}2_n$ (redundant information) are supplied to the statistics stage STA. Based on the knowledge of the instantaneous state of the transmission channel, the statistical data values $\hat{x}s_n, \hat{y}1s_n, \hat{y}2s_n$ are calculated in accordance with the following equations:

$$\hat{x}s_n = x_n \cdot \mu_{\hat{x}n}/\sigma_{\hat{x}n}^2$$

$$\hat{y}1s_n = \hat{y}1_n \cdot \mu_{\hat{y}1n}/\sigma_{\hat{y}1n}^2$$

$$\hat{y}2s_n = \hat{y}2_n \cdot \mu_{\hat{y}2n}/\sigma_{\hat{y}2n}^2 \qquad (1)$$

where $\mu_{\hat{x}}n, \mu\hat{y}1n, \mu\hat{y}2n$ designate the mean values and $\sigma_{\hat{x}}n^2$, $\sigma_{\hat{y}}1n^2, \sigma_{\hat{y}}2n^2$ designate the variances of the white noise with respect to the associated signal components.

The statistical data symbol values $\hat{x}s_n$ and $\hat{y}1s_n$ are stored in the data memory MAP_RAM1. The statistical data values $\hat{y}2s_n$ are stored in the data memory MAP_RAM2. The memory sizes of MAP_RAM1 and MAP_RAM2 are (in each case) dimensioned in such a manner that the statistical data values of an entire block (e.g. N=5120) can be accommodated.

Iterative turbo decoding is performed on the basis of the systematic information $\hat{x}s_n$, which is representative of a datablock, and on the basis of the redundant information $\hat{y}1s_n$ and $\hat{y}2s_n$. The iteration loop is formed by the units MAP1, DVE1, MAP2, DVE2 and the return of feedback information $z2s_n$ from DVE2 to MAP1.

More precisely, the first MAP symbol estimator MAP1 calculates a first sequence of value-continuous logarithmic first reliability information $z1_n$ (it_no=1) on the basis of the input data values $\hat{x}s_n$, $\hat{y}1s_n$ and an initial feedback information item $z2s_n$ ($it_{13}$ no=0) in a first iteration step (it_no=1). The first iteration sequence of logarithmic reliability information is interleaved in the turbo interleaver IL and statistically edited in the statistic stage STA. Statistical editing occurs in accordance with the following equation:

$$z1s_n = z1_n \cdot \mu_{z1n} / \sigma_{z1n}^2 \qquad (2)$$

where $\mu_{z1n}$ designates the mean value and $\sigma_{z1n}^2$ designates the variance of the white noise of the first reliability information $z1_n$.

The subsequent values $z1s_x$ (it_no=1) are temporarily stored in the random-access data memory APR_RAM of the first data processing unit DVE1 to carry out the interleaving and statistical editing procedures.

The data values $z1s_n$ (it_no=1), which are generated in the first data processing unit DVE1 during the first iteration, of the interleaved sequence of first reliability information (first iteration) are transferred to the second MAP symbol estimator MAP2. The MAP2 calculates a sequence of second logarithmic reliability information $z2_n$ (it_no=1) from the data values and the sequence $\hat{y}2S_n$ (identical for all iteration passes). The individual values of the sequences of first and second reliable information are logarithmic a posteriori probability ratios, so-called log likelihood ratios ("LLR").

The sequence of second reliability information $z2_n$ (it_no=1) is supplied to the turbo deinterleaver DIL and to the statistic stage STA of the second data processing unit DVE2, and is deinterleaved and statistically edited there. The statistical editing is done in accordance with the following equation:

$$z2s_n = z2_n \cdot \mu_{z2n} / \sigma_{z2n}^2 \qquad (3)$$

where $\mu_{z2n}$ designates the mean value and $\sigma_{z2n}^2$ designates the variance of the white noise of the second reliability information $z2_n$.

The random-access data memory APR_RAM is again used for temporarily storing the data values $z2s_n$ (it_no=1) generated in the manner described. According to FIG. 4, they are available to the first symbol estimator MAP1 as feedback information during the next iteration pass (it_no=2).

The data values $z2_n$ (it_no=5) generated at the output of the turbo deinterleaver DIL of the second data processing unit DVE2 are supplied (deinterleaved) to a threshold decider TL after a predetermined number (for example, 5) of iteration passes. The threshold decider TL determines a reconstructed data symbol $\hat{u}_n=0$ for each element of the specified data sequence having a value$\geq 0$ and a reconstructed data symbol $\hat{u}_n=1$ for each element of said data sequence having a value>0.

The subsequent figures will show that the statistics stages STA (shown several times in FIG. 4), the first and second symbol estimators MAP1, MAP2 and the random-access data memories APR_RAM can be implemented in each case in the form of one and the same hardware structure. The arrows drawn in the lower part of FIG. 4 identify the data transfer locations implemented by a bidirectional interface, at which a data transfer between a symbol estimator (which contains MAP1/2 and the associated memories MAP_RAM1/2 [drawn shaded]) and a digital signal processor (which contains DVE1/2, DMUX, STA, TL [not shaded]) is made.

It should be mentioned that the statistics stage STA can also be constructed in hardware, and can be integrated in the symbol estimator.

Figure 5:
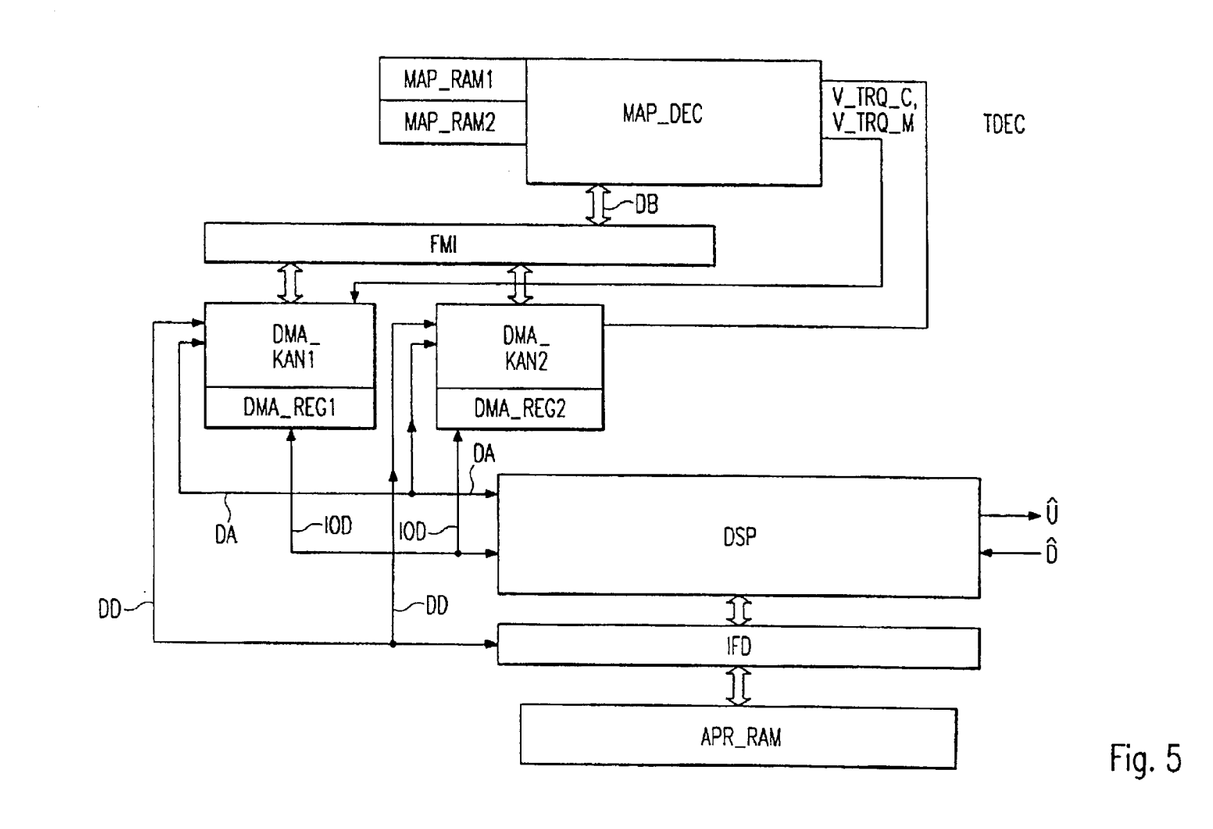
FIG. 5 is a block diagram of the turbo decoder of FIG. 4.

FIG. 5 shows a block diagram of the turbo decoder TDEC, which is already described by FIG. 4. The turbo decoder TDEC includes a MAP decoder MAP_DEC (which corresponds to the two symbol estimators MAP1/2 of FIG. 4) that is connected to the two MAP data memories MAP_RAM1 and MAP_RAM2. The MAP decoder MAP_DEC is connected to two programmable DMA (direct memory access) channels DMA_KAN1 and DMA_KAN2 via a bidirectional databus DB and an FMI (flexible memory interface) FMI. The "position" of the flexible memory interface FMI with associated DMA channels DMA_KAN1 and DMA_KAN2 in the turbo decoder sequence is indicated by the arrows (as is already shown in FIG. 4).

The programmable DMA channels DMA_KAN1/2 in each case contain internal DMA registers DMA_REG1, DMA_REG2. The internal DMA registers DMA_REG1/2 are connected to a digital signal processor DSP via respective programming lines IOD for bidirectional data exchange.

The DSP has access to the data memory APR_RAM via data lines and an internal DSP interface IFD. Furthermore, the DSP and the DSP interface IFD are connected to the DMA channels DMA_KAN1/2 via a bidirectional bus structure containing a databus DD and an address bus DA for exchanging data.

The DSP carries out the statistical calculations and interleaving and deinterleaving procedures (see FIG. 4), and possibly also the data processing steps carried out by the units DMUX and TL, by processing a programmed software (i.e., firmware) and temporarily storing data in the data memory APR_RAM.

The data transmission via the DMA channels DMA_KAN1/2 and the FMI interface FMI to the MAP decoder MAP_DEC is initiated by two data request control signals V_TRQ_M (request for data transfer via the first DMA channel DMA_KAN1) and V_TRQ_C (request for data transfer via the second DMA channel DMA_KAN2).

The input data for the first and second symbol estimation (MAP1 and MAP2 mode) are transmitted via the first DMA channel DMA_KAN1. For the first symbol estimation, these are, on the one hand, the statistical data values of the systematic information $\hat{x}s_n$ and the statistical data values of the first redundant information $\hat{y}1s_n$ that only need to be transmitted once at the beginning of a block decoding sequence. On the other hand, these are the statistically edited data values $z2s_n$ (it_no) of the feedback information that are transmitted in each iteration pass of the turbo decoding.

In the two tables 1 and 2, a data format (used with a word length of 16 bits) of the input values for the first symbol estimator MAP1 are shown.

TABLE 1

(data transfer to MAP1, once per block)

| Bits 0–3 | Bits 4–7 | Bits 8–11 | Bits 12–15 |
|---|---|---|---|
| $\hat{x}s_1$ | | $\hat{y}1s_1$ | |
| $\hat{x}s_2$ | | $\hat{y}1s_2$ | |
| $\hat{x}s_3$ | | $\hat{y}1s_3$ | |
| ... | | ... | |
| $\hat{x}s_N$ | | $\hat{y}1s_N$ | |

TABLE 2

(data transfer to MAP1 with each iteration pass)

| Bits 0–3 | Bits 4–7 | Bits 8–11 | Bits 12–15 |
|---|---|---|---|
| | $z2s_1$ (it_no = 1 – 5) | | |
| | $z2s_2$ (it_no = 1 – 5) | | |
| | $z2s_3$ (it_no = 1 – 5) | | |
| | ... | | |
| | ... | | |
| | $z2s_N$ (it_no = 1 – 5) | | |

For the second symbol estimation (MAP2 mode), the statistical data values of the second redundant information $ŷ2s_n$, and in each iteration pass, the statistically edited data values of the first reliability information $z1s_n$ (it_no) are fed to the MAP decoder MAP_DEC via the first DMA channel DMA_KAN1, the bidirectional FMI interface FMI and the databus DB.

TABLE 3

(data transfer for the second symbol estimation, once per block)

| Bits 0–3 | Bits 4–7 | Bits 8–11 | Bits 12–15 |
|---|---|---|---|
| $ŷ2s_1$ | | | |
| $ŷ2s_2$ | | | |
| $ŷ2s_3$ | | | |
| ... | | | |
| ... | | | |
| $ŷ2s_N$ | | | |

TABLE 4

(data transfer to MAP2, with each iteration pass)

| Bits 0–3 | Bits 4–7 | Bits 8–11 | Bits 12–15 |
|---|---|---|---|
| | $z1s_1$ (it_no = 1 – 5) | | |
| | $z1s_2$ (it_no = 1 – 5) | | |
| | $z1s_3$ (it_no = 1 – 5) | | |
| | ... | | |
| | ... | | |
| | $z1s_N$ (it_no = 1 – 5) | | |

The second DMA channel DMA_KAN2 is used for transmitting the result values (output data) $z1_n$ and $z2_n$ of the symbol estimators MAP1 and MAP2, respectively, to the DSP.

Figure 6:
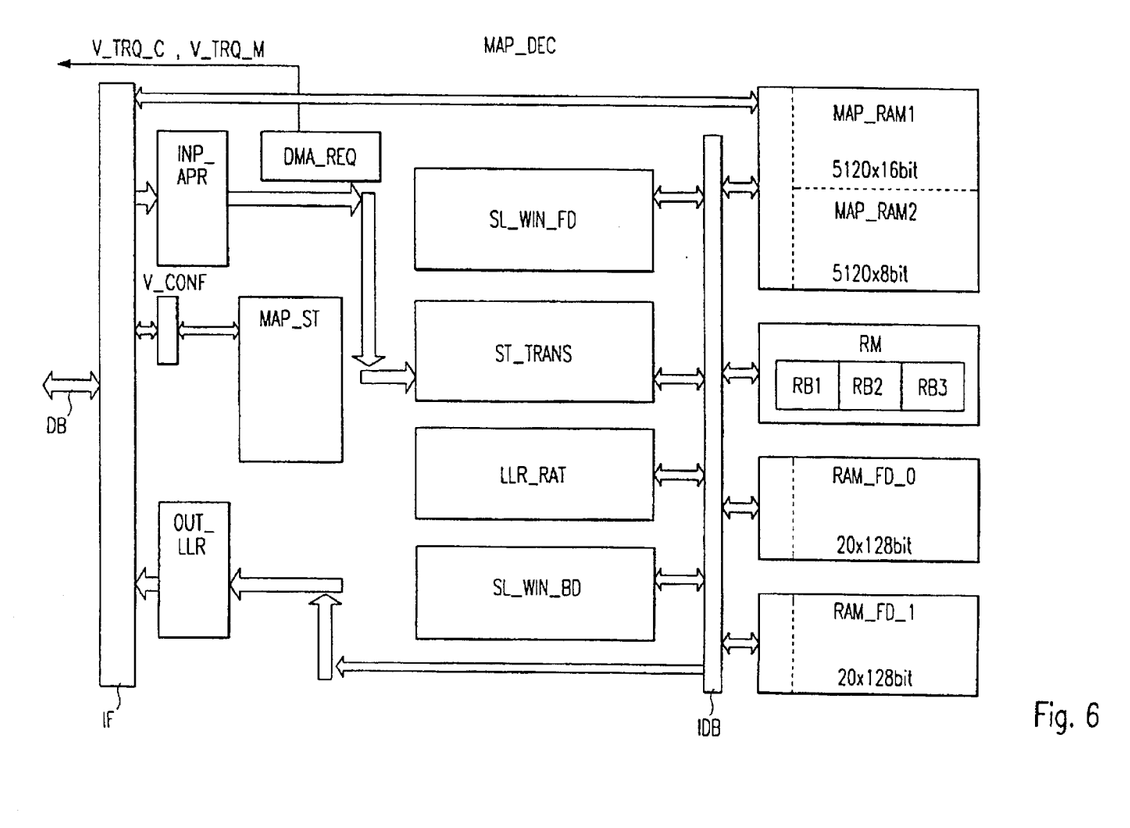
FIG. 6 is a simplified block diagram of a MAP decoder of FIG. 5.

FIG. 6 shows a block diagram of the MAP decoder MAP_DEC. The data transmitted via the databus DB are transferred to an internal interface IF.

The MAP decoder MAP_DEC includes an input data memory INP_APR, an output data memory OUT_LLR, a configuration register V_CONF, a DMA request unit DMA_REQ for generating the request control signals V_TRQ_C and V_TRQ_M and a module for generating standard-specific code information (trellis information) MAP_ST, in addition to the internal interface IF and the two MAP data memories MAP_RAM1 (e.g. N×16 bits) and MAP_RAM2 (e.g. N×8 bits).

Furthermore, the MAP decoder MAP_DEC includes a control unit ST_TRANS for controlling the calculation of transition metric values, a control unit SL_WIN_FD for controlling the calculation of forward recursion metric values, a control unit SL_WIN_BD for controlling the calculation of reverse recursion metric values and a control unit LLR_RAT for controlling the calculation of values of the first and second reliability information $z1_n$(it_no) and $z2_n$(it_no), respectively. The four control units are connected to a computing device RM, which includes three hardware computing chips RB1, RB2, RB3, via an internal databus IDB for exchanging data.

Furthermore, it is possible to access two data memories for forward recursion metric values, namely RAM_FD_0 and RAM_FD_1 (both with a size of, e.g., 20×128 bits) via the internal databus IDB. RAM_FD_0 contains forward recursion metric values, which are generated due to a transition with an input bit of 0. RAM_FD_1 contains forward recursion metric values that are generated due to a transition with an input bit of 1.

The MAP decoder shown in FIG. 6 operates as follows. During an initialization process, the MAP decoder MAP_DEC is first informed via the databus DB as to which code forms the basis of the coding of the data signal to be transmitted at the transmitter end. According to the invention, the available codes include at least one turbo code. In accordance with the basic code, code-specific input data values are generated for the first computing chip RB1 in the module MAP_ST. This will still be explained in greater detail in conjunction with FIG. 8.

The data values $x̂s_n$, $ŷ1s_n$ and $ŷ2s_n$ of the systematic information (already statistically edited in the DSP) and of the first and second redundant information for a datablock (n=1, . . . N) are first loaded into the data memories MAP_RAM1/2 to decode an entire datablock.

The MAP decoder MAP_DEC operates in MAP1 mode at the beginning of the decoding. Transition metric values are generated in the first computing chip RB1 under the control of the control unit ST_TRANS on the basis of the memory content of MAP_RAM1 and of the initial feedback information $z2s_n$ (it_no=0). Forward and reverse recursion metric values are generated in the second computing chip RB2 under the control of the control units SL_WIN_FD and SL_WIN_BD. The logarithmic values of the first reliability information with regard to the first iteration pass $z1_n$ (it_no=1) are generated by the third computing chip RB3 under the control of the control unit LLR_RAT. The values are supplied to the DSP via the output data memory OUT_LLR, the internal interface IF and the databus DB.

As already described by FIG. 4, the (interleaved and statistically edited) data values $z1s_n$ (it_no=1), which are generated by the DSP, are returned to the MAP decoder MAP_DEC after a request by the control signal V_TRQ_C, and are initially temporarily stored in the input data memory INP_APR.

The MAP decoder MAP_DEC then operates in MAP2 mode. IN other words, the calculation procedure described above is now carried out on the basis of the data values ($ŷ2s_n$) stored in the second MAP data memory MAP_RAM2 and the values temporarily stored in the input data memory INP_APR. The values of the second reliability information $z2_n$ (it_no=1) is again output via the output data memory OUT_LLR.

The calculation of the LLRs by forward and reverse recursion is explained in greater detail with reference to the calculation of the first reliability information $z1_n$ below.

Each value $z1_n$ is a value-continuous logarithmic probability ratio for the uncoded data symbol $u_n$ of the input signal sequence U. The value $z1_n$ is represented by $$z1_n = \ln\left\{\frac{P(u_n = 1 | \hat{X}, \hat{Y}1, Z2)}{P(u_n = 0 | \hat{X}, \hat{Y}1, Z2)}\right\} \quad (4)$$

where $P(u_n=1|\hat{X}, \hat{Y}1, Z2)$ and $P(u_n=0|\hat{X}, \hat{Y}1, Z2)$ designate the conditional probabilities (for the data symbol $u_n$ of 1 or 0, respectively), with the condition that the sequences $\hat{X}$, $\hat{Y}1$, $Z2$ are observed. The conditional probabilities are a posteriori probabilities, since the probabilities of the uncoded data symbols $u_1$ to $u_N$ forming the basis of an event are inferred from the event that has occurred (i.e., the "measured" sequences $\hat{X}$, $\hat{Y}1$, $Z2$).

The state of the convolutional coder RSC1 at the transmitter end at time n (i.e. at the input data symbol $u_n$) is designated by $S_n$.

The conditional a posteriori probabilities in the equation (4) can be expressed as sums of individual a posteriori probabilities over the $M=2^{L-1}$ possible states $S_n=0, 1, \ldots, M-1$ of the coder RSC1. L designates the depth, to which the turbo code generated reaches back, in the following equation:

$$z1_n = \ln\left\{\frac{\sum_{m=0}^{M-1} P(u_n = 1, S_n = m | \hat{X}, \hat{Y}1, Z2)}{\sum_{m=0}^{M-1} P(u_n = 0, S_n = m | \hat{X}, \hat{Y}1, Z2)}\right\} \quad (5)$$

The individual probabilities can be written in the following form:

$$P(u_n=i, S_n=m | \hat{X}, \hat{Y}1, Z2) = \alpha_n^i(m) \cdot \beta^n(m) \text{ for } i=0, 1$$

where $$\alpha_n^i(m) = P(u_n=i, S_n=m | R_1^N)$$

$$\beta_n(m) = \frac{p(R_{n+1}^N | S_n = m)}{p(R_{n+1}^N | R_1^N)} \quad (6)$$

where the sequence $$R_v^\mu = (R_v, \ldots, R_\mu); \; 1 \leq v \leq \mu \leq N \quad (7)$$

containing the value triples, $R_n=(\hat{x}_n, \hat{y}1_n, z2_n)$ of systematic information, redundant information and feedback information, is defined in order to simplify the notation.

The expressions $\alpha_n^i(m)$ and $\beta_n(m)$ and are called forward recursion and reverse recursion metrics, since they can be determined recursively (assuming that the transition metric values $\gamma_n^i(R_n, m', m)$ are known). The transition metric values $\gamma_n^i(R_n, m', m)$ are the probabilities of transition from a first state $S_{n-1}=m'$ to a second state $S_n=m$ of the coder RSC1 and the trellis diagram, i.e., $$\gamma_n^i(R_n, m', m) = P(u_n=i, S_n=m, R_n | S_{n-1}=m') \quad (8)$$

A detailed description of the recursions (when using an optimum MAP symbol estimation) is given in the chapter E.3.3, "Rekursive MAP-Symbolschätzung" (Recursive MAP symbol estimation), of the aforementioned book by P. Jung at pages 353 to 361. The recursions normally run over the entire block. In other words, the forward recursion begins at time n=1 (first bit of sequences $\hat{X}$, $\hat{Y}1$, $Z2$: MAP1, and of sequences $\hat{Y}2$, $Z1$: MAP2, respectively) and ends at time n=N (last bit of sequences $\hat{X}$, $\hat{Y}1$, $Z2$:MAP1, and of sequences $\hat{Y}2$, $Z1$:MAP2, respectively), and the reverse recursion begins at time n=N and ends at time n=1.

By contrast, a number of reverse and forward recursions, which in each case extend (only) over part-intervals of the datablock, are preferably performed for each data block for calculating the LLRs $z1_n$ and $z2_n$ in the exemplary embodiment of the MAP decoder MAP_DEC.

An interval length (window size) of, for example, DV=20 is established for the forward recursions in the control unit SL_WIN_FD. For example, beginning at n=0, the first 20 forward recursion metric values $\alpha_0^i(m), \ldots, \alpha_{19}^i(m)$ are first determined in a first forward recursion run VR1 (see FIG. 7) in the second computing chip RB2, and, as already mentioned, are temporarily stored in the forward recursion memory areas RAM_FD_0 (for i=0) and RAM_FD_1 (for i=1) respectively.

Figure 7:
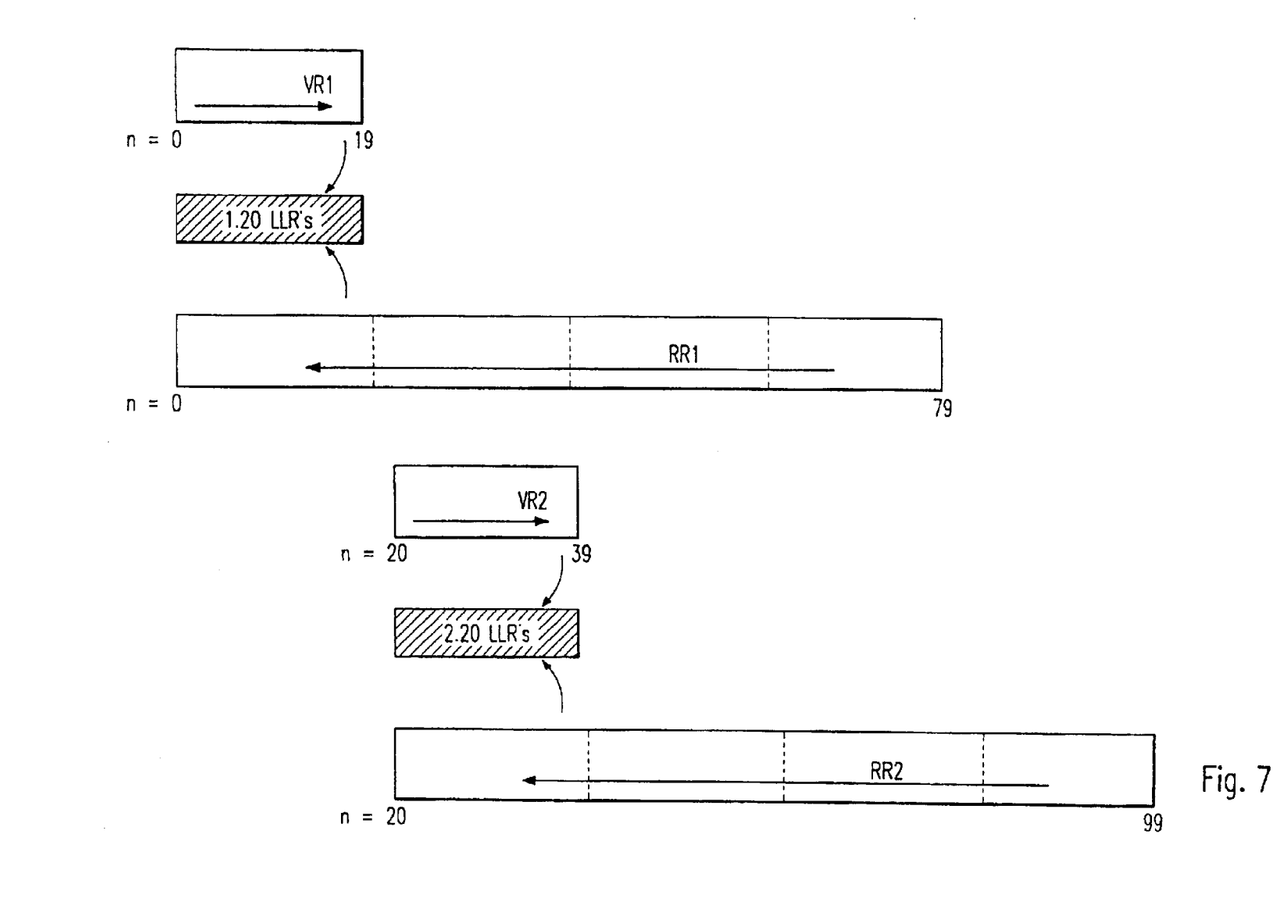
FIG. 7 is a functional block diagram illustrating a segmented forward and reverse recursion in calculating a reliability information.

For the associated first reverse recursion RR1, an interval length for reverse recursions (window size) of, for example, DR=80 is established in SL_WIN_BD. The length of the reverse recursion window is preferably determined in accordance with the equation DR=L×DV. Thus, the first reverse recursion begins at n=79 and runs to n=0 under the control of SL_WIN_BD. The corresponding reverse recursion metric values $\beta_n(m)$ are calculated in the second computing chip RB2.

All the 20 values calculated for $\alpha_n^1(m)$ and the last 20 values calculated for $\beta_n(m)$ are used for calculating the LLRs in the datablock segment n=0, 1, ..., 19,. As already mentioned, the calculation is done in the third computing chip RB3 under the control of LLR_RAT. It is not necessary to store the reverse recursion metric values, since they can be further processed immediately for calculating the LLRs.

The two recursion windows are in each case shifted "to the right" by 20 values after the calculation of the first 20 LLRs.

Accordingly, the second forward recursion VR2 begins at n=20 and runs to n=39. The values obtained during the first forward recursion VR1 can be overwritten in RAM_FD_0 and RAM_FD_1 respectively during the temporary storage of the values $\alpha_{20}^i(m), \ldots, \alpha_{39}^i(m)$. The associated second reverse recursion RR2 begins at n=99 and runs back to n=20. The last 20 values calculated for $\beta_n(m)$ can again be transferred directly to the computing chip RE3 without any temporary storage. All 20 calculated values for $\alpha_n^i(m)$ and the last 20 values calculated for $\beta_n(m)$ are again used to calculate the LLRs in block segment n=20, 21, ..., 39.

This segment-by-segment determination of the LLRs with sliding forward and reverse recursion windows is continued in the manner described, controlled by LLR_RAT, until all the LLRs of the datablock have been calculated. The low storage space requirement for RAM_FD_0 and RAM_FD_1, and the fact that the reverse recursion metric values do not need to be stored are advantageous.

The approximate calculation of the transition metric values, of the forward and reverse recursion metric values and of the LLRs in the computing device RM are explained in greater detail below with reference to FIGS. 8, 9a–d and 10.

Figure 8:
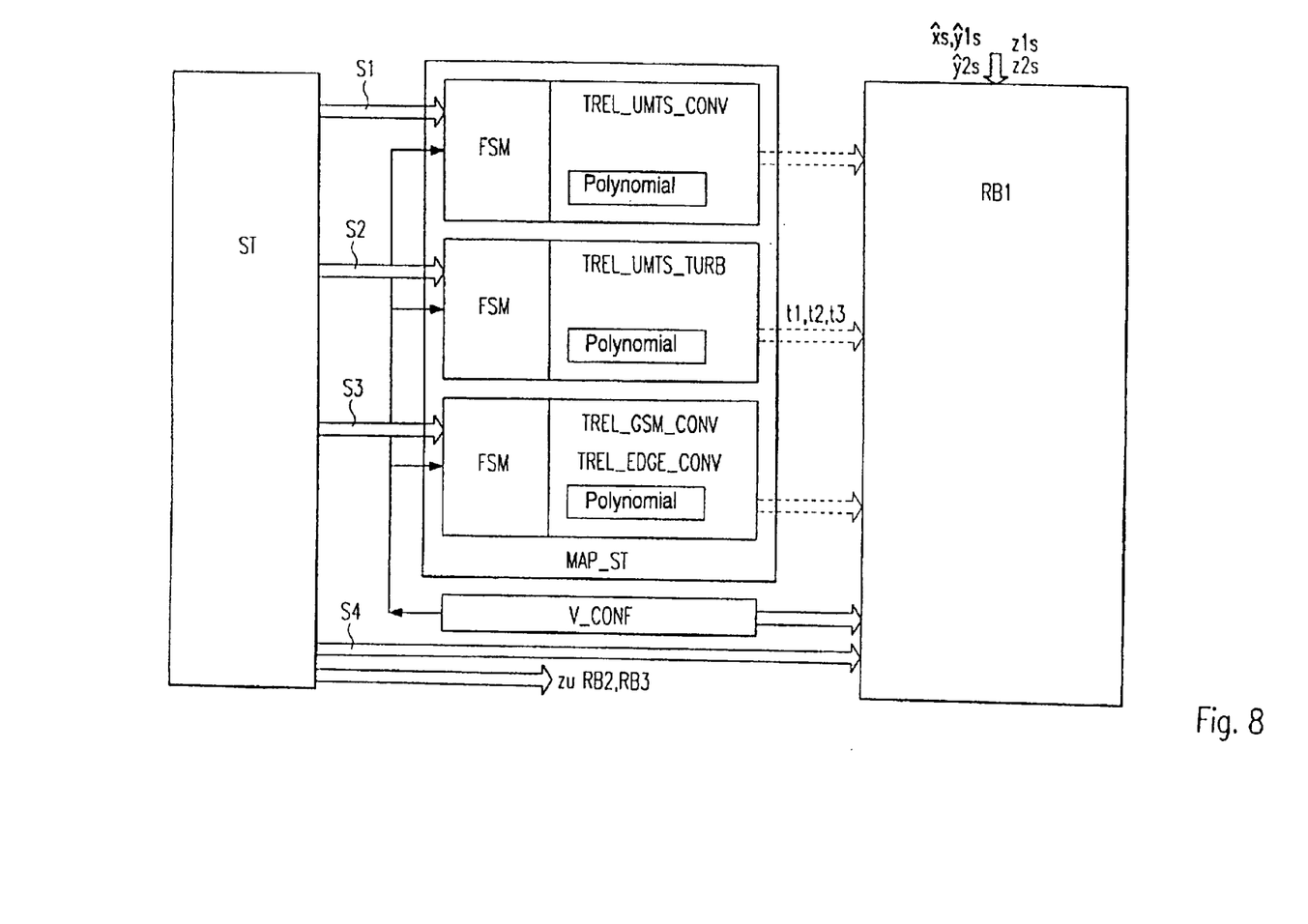
FIG. 8 is a block diagram of a control unit of FIG. 6 for generating a standard-specific code information.

The module MAP_ST includes three submodules TREL_UMTS_CONV, TREL_UMTS_TURB and TREL_GSM_CONV/-TREL_EDGE_CONV. All submodules contain their own state generator FSM.

A control unit ST is used for controlling the timing of and coordinating the state generators FSM and the computing chips RB1, RB2, RB3. The control unit ST is connected via control data lines S1, S2 and S3 to the state generators FSM of the submodules TREL_UMTS_CONV, TREL_UMTS_TURB, TREL_GSM_CONV/TREL_EDGE_CONV for this purpose. The control unit ST also controls the first computing chip RB1 via a further control dataline S4. Other control data lines lead to the other computing chips RB2, RB3.

Each submodule of MAP_ST calculates theoretical information (also designated as "trellis information"), which is characteristic of a particular code. The theoretical information is in each case calculated on the basis of a code-specific polynomial. The values of the theoretical information calculated in the submodules TREL_GSM_CONV and TREL_EDGE_CONV are based on the global system for mobile (GSM) communication and enhanced data services for GSM evolution (EDGE) standards. The theoretical values t1, t2, t3 calculated by the submodule TREL_UMTS_TURB are based on the universal mobile telecommunications system (UMTS) standard for turbo decoding.

Only the case of the selection of the submodule TREL_UMTS_TURB by V_CONF is considered below.

Figure 9A:
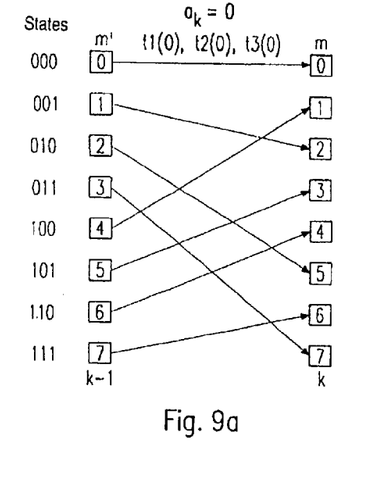
FIG. 9a is an illustration of possible transitions between start and end states of a turbo coder, when a bit of value 0 is input.
Figure 9B:
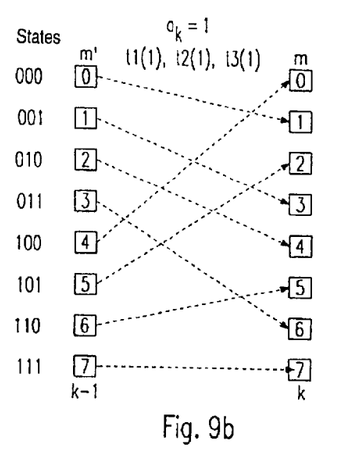
FIG. 9b is an illustration of the possible transitions between the start and end states of a turbo coder, when a bit of value 1 is input.

A turbo code with the reversion depth of L=4 is provided in UMTS. Consequently, the shift register of the convolutional coder RSC1 in the turbo coder (see FIG. 3) can assume precisely 8 states, namely 000, 001, 010, . . . etc. In FIGS. 9a and 9b, each of the 8 possible states is shown by a box numbered continuously with the index numbers m=0 to 7.

FIG. 9a shows the state transitions m' to m, which occur when the turbo coder, which is initially in an (arbitrary) initial state (at step k−1), is brought into a subsequent state (at step k) by adding an input bit $a_k$ of value 0 (i.e. i=0). A corresponding illustration which shows the state transitions occurring when an input bit $a_k$ of value 1 is added (i.e. i=1) is shown in FIG. 9b.

For each possible state transition (from k−1 to k), three theoretical values t1(i), t2(i), t3(i) are calculated.

The values t1(i) and t3(i) are identical to the added input bit $a_k$ (i.e. t1(i)=t3(i)=i). The value t2 is calculated by the code-specific polynomial.

Figure 9C:
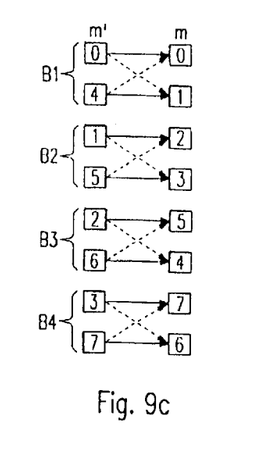
FIG. 9c is an illustration of four groups of transitions, ordered in accordance with the end states.
Figure 9D:
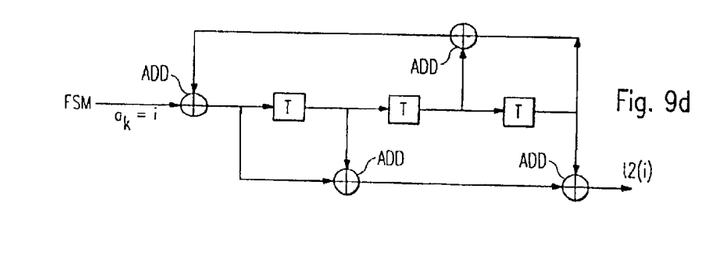
FIG. 9d is a block diagram of a computing stage for calculating theoretic information of a turbo code.

FIG. 9d shows a possible computing circuit for the value t2 from $a_k$. The computing circuit includes a shift register containing three memory cells T and four adders ADD, which are disposed in the circuit in the manner shown. The shift register is occupied in an initial state (e.g. m'=0, i.e. (000)) by the state generator FSM and is supplied with an input bit $a_k$. The values t2(i), i=0, 1 referred to the respective initial state, e.g., m'=0, are generated when the input bit $a_k$=i is added. This process is carried out for all initial states of the shift register.

Figure 10:
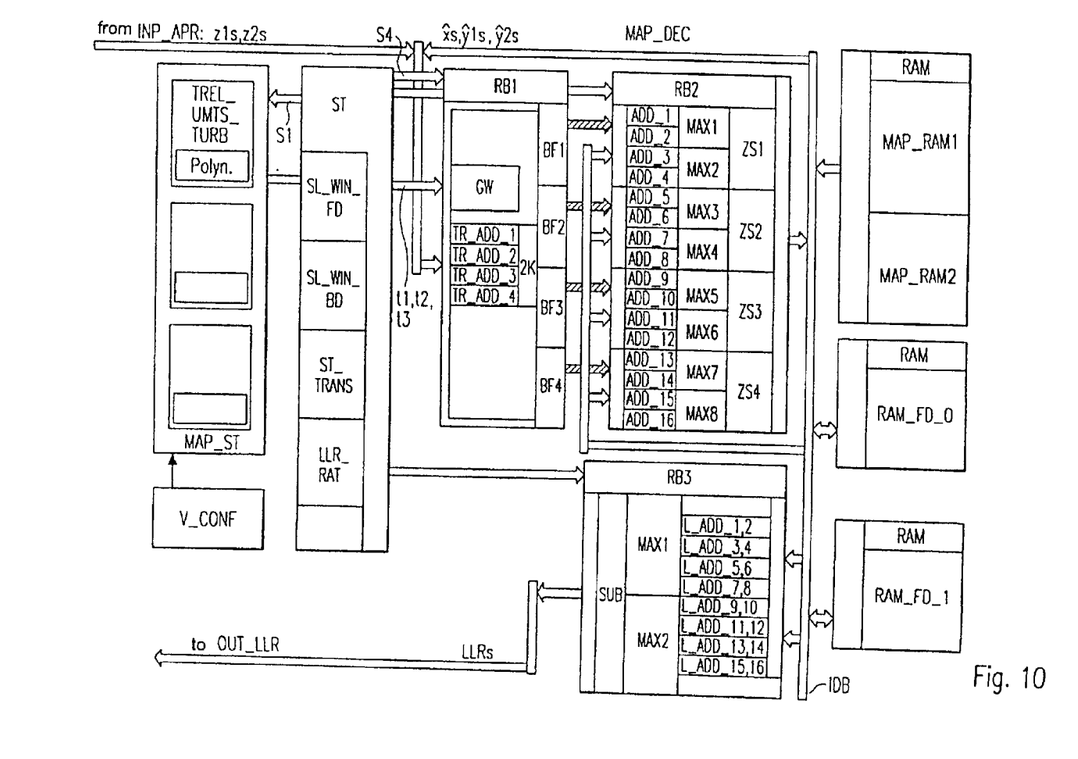
FIG. 10 is a block diagram of a hardware architecture of the MAP decoder of FIG. 6.

The configuration of the computing chips RB1, RB2 and RB3 is explained with reference to FIG. 10 below. The computing chips RB1, RB2, RB3 are fast data paths, which are completely built of combinatorial logic.

The first computing chip RB1 provided for calculating the transition metric values $\gamma_n^i(R_n, m', m)$ receives the theoretical values t1(i), t2(i), t3(i) generated for $a_k$=i, i=0, 1, and converts them into weight factors w1(i), w2(i), w3(i) in a circuit GW. The weight factors w1(i), w2(i), w3(i) are calculated as follows:

$$w1(i)=1-2\cdot t1(i)$$
$$w2(i)=1-2\cdot t2(i)$$
$$w3(i)=1-2\cdot t3(i) \quad (9)$$

The weight factors w1(i), w2(i), w3(i) are sign values, i.e., +1, −1. Using the sign values, the transition metric values $\gamma_n^i(R_n, m', m)$ are calculated by a multiplication with the "measured values".

In the MAP1 mode, $\hat{x}s_n, \hat{y}1s_n$ are available as measurement values and $z2s_n(\text{it\_no})$ is available as feedback information. The transition metric of a particular one of the total of 16 transitions (see FIG. 9a and 9b) is calculated in accordance with the following equation:

$$\gamma_n^i(R_n, m', m)=w1(i)\cdot \hat{x}s_n+w2(i)\cdot \hat{y}1s_n+w3(i)\cdot z2s_n(\text{it\_no}) \quad (10)$$

Since w1(i), w2(i), w3(i) are sign values, $\gamma_n^1(R_n, m', m)$ can assume a maximum of 8 different values. Only 4 values and the respective negative values need to be calculated, since the values are symmetric to 0.

The calculations are carried out in parallel, i.e., simultaneously with 4 adders TR_ADD_1, TR_ADD_2, . . . , TR_ADD_4 (each of which has three inputs according to equation (10)), and the subsequent twos complement stage 2K in RB1. The twos complement stage 2K forms the corresponding negative value for a calculated value.

The twos complement stage 2K is followed by a demultiplexer (not shown). This distributes the 8 calculated transition metric values $\gamma_n^i(R_n, m', m)$ to 4 memories BF1, BF2, . . . , BF4 with (in each case) 4 storage locations.

The distribution is carried out in such a manner that, in each memory BF1-4, the transition metric values $\gamma_n^i(R_n, m', m)$ of a butterfly are stored. A butterfly is a group containing 4 particular transition metric values $\gamma_n^i(R_n, m', m)$.

In FIG. 9c, 4 butterflies are shown. The first butterfly B1 includes the 4 transition metric values, which lead to the end states 0 and 1, the second butterfly B2 includes the 4 transition metric values, which lead to the end states 2 and 3, . . . , and the fourth butterfly B4 includes the 4 transition metric values, which lead to the end states 6 and 7.

Only two "measurement values" $\hat{y}2s_n$ and $z1s_n$ (it_no) are available in the MAP2 mode. The transition metric value of a particular one of the total of 16 transitions are calculated in accordance with the following equation:

$$\gamma_n^i(G_n, m', m)=w2(i)\cdot \hat{y}2s_n+w3(i)\cdot z1s_n(\text{it\_no}) \quad (11)$$

where $G_n$ designates the sequence containing the value pairs $(z1_n, \hat{y}2_n)$.

Since only two sign values w2(i), w3(i) need to be taken into consideration, $\gamma_n^i(G_n, m', m)$ can assume a maximum of 4 different values. The values can be calculated either directly by the 4 adders TR_ADD_1–4 or by 2 adders and the subsequent twos complement stage 2K.

The further processing path corresponds to that of the MAP1 mode.

The computing chip RB1 is controlled by the control unit ST_TRANS for combining the theoretical values (or the weight factors, respectively) with the "measurement values" alternately according to equations (10) and (11).

The 16 calculated transition metric values are supplied to a second computing chip RB2 by four parallel databus lines (in each case, one databus line per memory BF1–4).

The second computing chip RB2 performs the recursive calculation of the forward and reverse recursion metric values. It has 16 adders ADD_1, ADD_2, . . . , ADD_16, disposed in parallel, 8 maximum units MAX1, MAX2, . . . , MAX8, disposed in parallel and 4 buffers ZS1, ZS2, ZS3 and ZS4, disposed in parallel.

Each of the adders ADD_1–4 adds a transition metric value to a forward or reverse recursion metric value, which has been determined in the preceding recursion step, in the case of forward recursion to an initial state and in the case of reverse recursion to an end state.

The butterfly B1 will first be considered by way of an example to calculate the forward recursion metric values. The first adder ADD_1 adds the transition metric $\gamma_n^0(R_n, m'=0, m=0)$ to the forward recursion metric value $\alpha_{n-1}(m'=0)$ calculated in the preceding recursion step, resulting in a first possible value $\alpha_n^0(m=0)$ for the new forward recursion metric value $\alpha_n(m=0)$. The second adder ADD_2 adds the transition metric $\gamma_n^1(R_n, m'=4, m=0)$ to the forward recursion metric value $\alpha_{n-1}(m'=4)$ calculated in the preceding recursion step, resulting in a second possible value $\alpha_n^1(m=0)$ for the new forward recursion metric value $\alpha_n(m=0)$. The raised index of the possible forward recursion metric values specifies the input bit causing the respective transition.

According to the uppermost butterfly B1 shown in FIG. 9c, the two possibilities of reaching the end state m=0 are alternative.

The further adders operate analogously. In other words, the adders ADD_3 and ADD_4 calculate corresponding expressions with respect to the two alternatives in order to reach the other end state m=1 of the first butterfly B1, and so on.

In general, it is true that each pair of adders ADD_1/2, ADD_3/4, ..., ADD_15/16, processing such alternative transition metric values, is in each case followed by a maximum unit MAX1, MAX2, ..., MAX8. The maximum units MAX1, MAX2, ..., MAX8 select the more probable one of the two alternative transitions by discarding (in each case) the smaller one of the two possible values $\alpha_n^0(m)$, $\alpha_n^1(m)$ for the $\hat{y}2s_n$. The forward recursion metric values $\alpha_n(m)$ form the starting point for the next recursion step n after n+1.

Therefore, 8 forward recursion metric values $\alpha_n(m)$ for 4 butterflies are determined simultaneously in parallel data processing in RB2. The 8 calculated forward recursion metric values $\alpha_n(m)$ are temporarily stored in the buffers ZS1, ZS2, ZS3, ZS4 for calculating the recursion. The results $\alpha_n^0(m)$ and $\alpha_n^1(m)$ of the adders ADD_1–16 are supplied (via the databus IDB) to the forward recursion memory areas RAM_FD_0 and RAM_FD_1, respectively, where they are stored. The results are used by the computing chip RB3 later.

All 16 possible forward recursion metric values $\alpha_n^0(m)$, $\alpha_n^1(m)$ must be calculated, and stored in the forward recursion memory areas RAM_FD_0 and RAM_FD_1 within a 52-MHz cycle, with the data rate of 384 kbit/s used in UMTS.

The reverse recursion metric values are calculated analogously, but on the basis of transitions from an end state m to a starting state m'. The reverse recursion metric values calculated in the reverse recursion for the time n considered are also stored temporarily (i.e., only for the purpose of the recursion in the respective next recursion step) in the respective buffer ZS1, ZS2, ZS3 and ZS4. Thus, the buffers contain the forward and reverse recursion metric values of a butterfly for a particular time n.

It is not necessary to store the calculated reverse recursion metric values over the recursion run (differently from the forward recursion metric values in RAM_FD_0 and RAM_FD_1), since the reverse recursion metric values can be further processed immediately in the third computing chip RB3.

The third computing chip RB3 provided for calculating the LLR output values includes 16 adders L_ADD_1, L_ADD_2, ..., L_ADD_16, two maximum units MAX_1 and MAX_2, and a subtractor SUB.

The third computing chip RB3 converts the equation (5) (for the calculation of the LLRs) in accordance with an approximation expression $$\max_{m=0,\ldots,7}\{\alpha_n^1(m)+\beta_n(m)\} - \max_{m=0,\ldots,7}\{\alpha_n^0(m)+\beta_n(m)\}.$$

The approximation expression is proposed in the article "Comparison of Turbo Code Decoders Applied to Short Frame Transmission Systems", by Peter Jung in IEEE Journal of Selected Areas in Communications, Vol. 14, No. 3, April 1996, which becomes the subject matter of the present invention and which is incorporated by reference in its entirety.

The first 8 adders L_ADD_1–8 perform the addition of the forward recursion metric values to i=1 with the associated reverse recursion metric values (i.e., for the hypothesis $u_{n-1}$). In other words, each adder forms the sum $\alpha_n^1(m)+\beta_n(m)$ for one of the 8 states. The second 8 adders L_ADD_9–16 perform the addition of the forward recursion metric values to i=0 with associated reverse recursion metric values (i.e. for the hypothesis $u_n=0$). In other words, each adder forms the sum $\alpha_n^0(m)+\beta_n(m)$ for one of the 8 states.

The maximum unit MAX_1 receives the outputs of the first 8 adders L_ADD_1–8 and the maximum unit MAX_2 receives the outputs of the second 8 adders L_ADD_9–16. Each maximum unit MAX_1 and MAX_2, respectively, finds the respective maximum adder output by comparing all eight adder outputs and forwards the maximum adder output to the subtractor SUB. Thus, MAX_1 determines the value with the maximum probability among all transitions caused by an input bit i=1. MAX_2 determines the value with the maximum probability among all transitions caused by an input bit i=0. Using the logarithmic property ln(a/b)=ln(a)–ln(b), the subtractor SUB calculates the reliability information as the difference between the resultant values, i.e., the LLR value $z1_n$ ($it_{13}$ no) (in the MAP1 mode) and the LLR value $z2_n$ (it_no) (in the MAP2 mode) respectively.

The two computing chips (i.e., the second computing chip RB2 and the third computing chip RB3) can be combined in a common computing chip having only 16 adders in total, since both the second computing chip RB2 and the third computing chip RB3 in each case contains 16 adders. The 16 adders are operated in a multiplexing manner, i.e., the forward and reverse recursion metric values and the LLRs must be calculated alternately. The advantage lies in a reduction in the hardware expenditure.

We claim:

1. A turbo decoder for decoding a data signal, error-protection-coded with a turbo code at a transmitter end, transmitted via a disturbed channel, and detected by a receiver, the turbo decoder comprising:

at least one symbol estimator including:
an input for receiving data symbols attributable to the detected data signal;
an output for providing output values for determining estimated data symbols of the data signal forming a basis for the error protection coding at the transmitter end; and
a computing device configured to calculate, with the error protection code used at the transmitter end:
transition metric values; and
forward and reverse recursion metric values, and the output values therefrom;
said computing device containing a hardware computing chip constructed of combinatorial logic for generating at least one type of the values.

2. The turbo decoder according to claim 1, wherein said hardware computing chip includes a first hardware computing chip, and said first hardware computing chip includes four adders with outputs disposed in parallel and at least one twos complement stage disposed following said adders for generating the transition metric values.

3. The turbo decoder according to claim 2, wherein said first hardware computing chip contains eight adders disposed in parallel for generating the transition metric values.

4. The turbo decoder according to claim 2, wherein said first hardware computing chip contains four memories for storing four transition metric values.

5. The turbo decoder according to claim 1, wherein said symbol estimator has a control device for controlling said first hardware computing chip whereby said first hardware computing chip alternately determines the transition metric values according to a first and a second computing rule.

6. The turbo decoder according to claim 1, wherein said hardware computing chip includes a second hardware computing chip, and said second hardware computing chip contains an addition stage having a Q number of adders disposed in parallel and a maximization stage having a plurality of maximum units disposed in parallel for generating the forward and reverse recursion metric values, and each of said maximum units receives the outputs from two of said adders at input and outputs a larger one of the adder outputs.

7. The turbo decoder according to claim 6, wherein Q=16.

8. The turbo decoder according to claim 6, wherein said symbol estimator has a control device for controlling said second hardware computing chip, whereby forward and reverse recursion intervals having sliding interval boundaries are used within a datablock for calculating the forward and reverse recursion metric values.

9. The turbo decoder according to claim 1, wherein said hardware computing chip includes a third hardware computing chip, and said third hardware computing chip contains an addition stage having a number P of adders with outputs disposed in parallel and a maximization stage having two maximum units disposed in parallel for generating the output values, and each of said maximum units receives the outputs from P/2 of said adders at input and outputs a largest one of the adder outputs.

10. The turbo decoder according to claim 9, wherein P=16.

11. The turbo decoder according to claim 9, wherein said third hardware computing chip has a subtractor for determining a difference between the outputs of said two maximum units for generating the output values.

12. The turbo decoder according to claim 1, wherein said symbol estimator has a control device for controlling said third hardware computing chip whereby said third hardware computing chip combines the forward and reverse recursion metric values within sliding interval boundaries.

13. The turbo decoder according to claim 6, wherein said second hardware computing chip and said third hardware computing chip use common ones of said adders in a multiplex operation.

14. The turbo decoder according to claim 1, further comprising:
   a digital signal processor for carrying out a turbo interleaving and a deinterleaving procedure and for calculating statistical information representative of an instantaneous channel state in accordance with a predetermined sequence program; and
   a bidirectional interface for connecting said digital signal processor to said symbol estimator for exchanging data.

15. The turbo decoder according to claim 1, wherein said symbol estimator is used for calculating a first reliability information and a second reliability information during an iteration pass.

16. A turbo decoder for decoding a data signal, error-protection-coded with a turbo code at a transmitter end, transmitted via a disturbed channel, and detected by a receiver, comprising:
   at least one symbol estimator including:
      an input for receiving data symbols attributable to the detected data signal;
      an output for providing output values for determining estimated data symbols of the data signal forming a basis for the error protection coding at the transmitter end; and
      a computing device configured to calculate, with the error protection code used at the transmitter end:
         transition metric values; and
         forward and reverse recursion metric values and the output values therefrom;
      said computing device containing computing chips including a first computing chip, a second hardware computing chip and a third computing chip, constructed of combinatorial logic for generating at least one type of the values.

* * * * *